United States Patent
Narkhede et al.

(10) Patent No.: US 7,160,757 B2
(45) Date of Patent: Jan. 9, 2007

(54) GAP CONTROL BETWEEN INTERPOSER AND SUBSTRATE IN ELECTRONIC ASSEMBLIES

(75) Inventors: Madhuri R. Narkhede, Chandler, AZ (US); Tom M. Lappin, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/114,392

(22) Filed: Apr. 25, 2005

(65) Prior Publication Data

US 2006/0240658 A1    Oct. 26, 2006

(51) Int. Cl.
*H01L 21/50* (2006.01)
(52) U.S. Cl. .............. 438/117; 438/108; 257/E21.499
(58) Field of Classification Search ............... None
See application file for complete search history.

(56) References Cited

U.S. PATENT DOCUMENTS

| | | | |
|---|---|---|---|
| 3,871,015 A * | 3/1975 | Lin et al. .................. 257/779 |
| 4,545,610 A * | 10/1985 | Lakritz et al. .............. 438/125 |
| 5,950,073 A * | 9/1999 | Griffin et al. .............. 438/119 |
| 5,968,670 A * | 10/1999 | Brofman et al. ............ 428/576 |
| 6,506,681 B1 | 1/2003 | Grigg et al. ............... 438/692 |
| 6,552,425 B1 | 4/2003 | Yan et al. .................. 257/690 |
| 6,559,527 B1 * | 5/2003 | Brofman et al. ............ 257/678 |
| 6,653,730 B1 | 11/2003 | Chrysler et al. ............ 257/704 |
| 6,667,548 B1 | 12/2003 | O'Connor et al. .......... 257/712 |
| 6,673,697 B1 | 1/2004 | Ma et al. .................. 438/455 |
| 6,703,697 B1 * | 3/2004 | Leahy et al. ............... 257/678 |
| 6,753,613 B1 | 6/2004 | Levardo et al. ............ 257/780 |
| 2004/0109283 A1 | 6/2004 | Emma et al. ............... 361/683 |
| 2005/0051906 A1 | 3/2005 | He et al. ................... 257/779 |
| 2005/0067685 A1 | 3/2005 | Patel ....................... 257/690 |

* cited by examiner

*Primary Examiner*—Scott B. Geyer
(74) *Attorney, Agent, or Firm*—Konrad Raynes & Victor, LLP; Alan S. Raynes

(57) ABSTRACT

Electronic assemblies and methods for forming assemblies are described. One embodiment includes a method of forming an electronic assembly, including forming a plurality of first solder bumps on one of a substrate and an interposer. The substrate and interposer are positioned so that the first solder bumps are located between the substrate and the interposer. A gap control structure is positioned between the substrate and the interposer. A first reflow operation that reflows and then solidifies the first solder bumps is performed. The first reflow operation couples the interposer to the substrate. A plurality of second solder bumps are formed on one of the interposer and a die. The interposer and die are positioned so that the second solder bumps are located between the interposer and the die. A second reflow operation that reflows and then solidifies the second solder bumps is performed. The second reflow operation couples the die to the interposer. The second reflow operation also reflows the first solder bumps, and the gap control structure between the substrate and the interposer inhibits a change in a gap between the substrate and the interposer during the second reflow operation. Other embodiments are described and claimed.

14 Claims, 5 Drawing Sheets

GAP CONTROL BETWEEN INTERPOSER AND SUBSTRATE IN ELECTRONIC ASSEMBLIES

RELATED ART

Integrated circuits may be formed on semiconductor wafers made from materials such as silicon. The semiconductor wafers are processed to form various electronic devices thereon. The wafers are diced into semiconductor chips, which may then be attached to a package substrate using a variety of known methods. The package substrate is commonly formed from ceramics or polymers having conducting regions thereon. The die on the package substrate may be encapsulated with a polymer material for protection. In one known method for attaching a chip or die to a package substrate, the die may have solder bump contacts which are electrically coupled to the integrated circuit. The solder bump contacts extend onto the contact pads of a package substrate, and are typically attached in a thermal reflow process. Electronic signals may be provided through the solder bump contacts to and from the integrated circuit.

The material of package substrate typically does not provide a match with the material of the integrated circuit die with respect to the coefficient of thermal expansion. Thermal expansion mismatch can lead to undesirable stresses developing in the electronic assembly during processing procedures, in particular, during heating and cooling operations. Such stresses may cause cracks in the electronic assembly or individual components thereon, and lead to failure or performance degradation. In addition, a larger pitch between contacts and larger solder balls are sometimes required in order to provide adequate mechanical strength of the electrical connections. Furthermore, the size difference between the die and the package substrate may also lead to difficulties in layout and signal routing from the substrate to the die.

As a result of one or more problems such as those described above, interposer structures have been placed between the die and the package substrate. Such interposer structures provide better thermal expansion characteristics in the electronic assembly. Interposers also can add to the functionality of the package, such as permitting better layout and routing of signals from the die to the package substrate. Active and passive devices may also be formed in the interposer itself. In addition, the use of an interposer can permit the use of smaller solder bump contacts and smaller pitch between contacts, due to the lower stresses in the device.

BRIEF DESCRIPTION OF THE DRAWINGS

Embodiments are described by way of example, with reference to the accompanying drawings, which are not drawn to scale, wherein.

DETAILED DESCRIPTION

Figure 1:
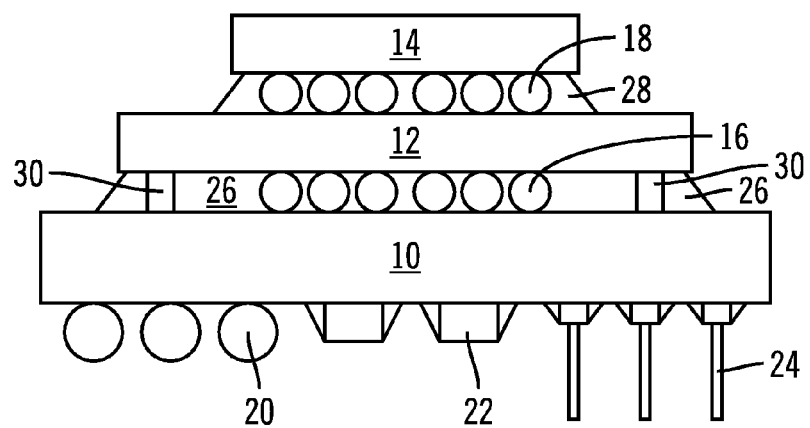
FIG. 1 is a cross-sectional side view of components of an electronic assembly including a die, an interposer, and a substrate, in accordance with certain embodiments.

FIG. 1 illustrates an electronic assembly including various features found in certain embodiments. A package substrate 10 has an interposer 12 and die 14 positioned thereon. The die 14 may be formed from a material such as silicon and have circuitry thereon that is to be coupled to the interposer 12. The package substrate 10 may in turn be coupled to another body, for example, a computer motherboard (not shown). Connections between the package substrate 10, interposer 12, and die 14 may be made using any suitable structure, for example, the solder bumps 16 and 18. Likewise, connections between the package substrate 10 and another body may be made using any suitable structure, for example, solder bumps 20 or pins 24. The package substrate may include a variety of electronic structures formed thereon or therein, including, for example, capacitors 22. The interposer 12 may also include electronic structures formed thereon or therein, if desired. A variety of materials may be used for forming the package substrate and the interposer. In certain embodiments, the package substrate 10 is an organic substrate made up of one or more layers of polymer base material, with conducting regions for transmitting signals. In certain embodiments, the interposer 12 is made up of a ceramic base material including metal regions for transmitting signals.

In manufacturing a structure including the package substrate 10, interposer 12, and die 14, the interposer 12 may be coupled to the package substrate 10 by reflowing the first solder bumps 16. The die may be coupled to the interposer by reflowing the second solder bumps 18. During the second reflow process, for coupling the die 14 to the interposer 12, the first solder bumps 16 between the interposer 12 and the package substrate 10 will usually be reflowed for a second time. This second reflowing of the first solder bumps 16 can change the shape of the first solder bumps 16 and even cause partial or total collapse of the first solder bumps 16. These changes to the shape of the first solder bumps 16 can change the size of the gap between the package substrate 10 and the interposer 12, which can lead to various problems in the electronic assembly.

As illustrated in FIG. 1, the electronic assembly includes gap control structures 30 positioned between the package substrate 10 and the interposer 12. These gap control structures 30 are formed prior to the reflowing of the second solder bumps 18 between the interposer 12 and the die 14. The gap control structures may in certain embodiments be preferable formed from a high viscosity sealant such as an epoxy that may be cured during solder bump reflow. After formation of the gap control structures 30, the reflowing of the solder balls 16 can proceed in order to attach the die 14 to the interposer 12. The gap control structures 30 act to inhibit any change in the height of the gap between the package substrate 10 and the interposer 12, which otherwise might occur due to subsequent reflowing and possible collapse of the first solder bumps 16 during the reflow of the second solder bumps 18 during the attachment of the die 14 to the interposer 12.

FIG. 1 also shows the presence of underflow material 28 between the interposer 14 and die 16, and underflow material 26 between the package substrate 10 and the interposer 12. The underflow materials 26, 28 may be a polymer that is injected between the layers.

Figure 2:
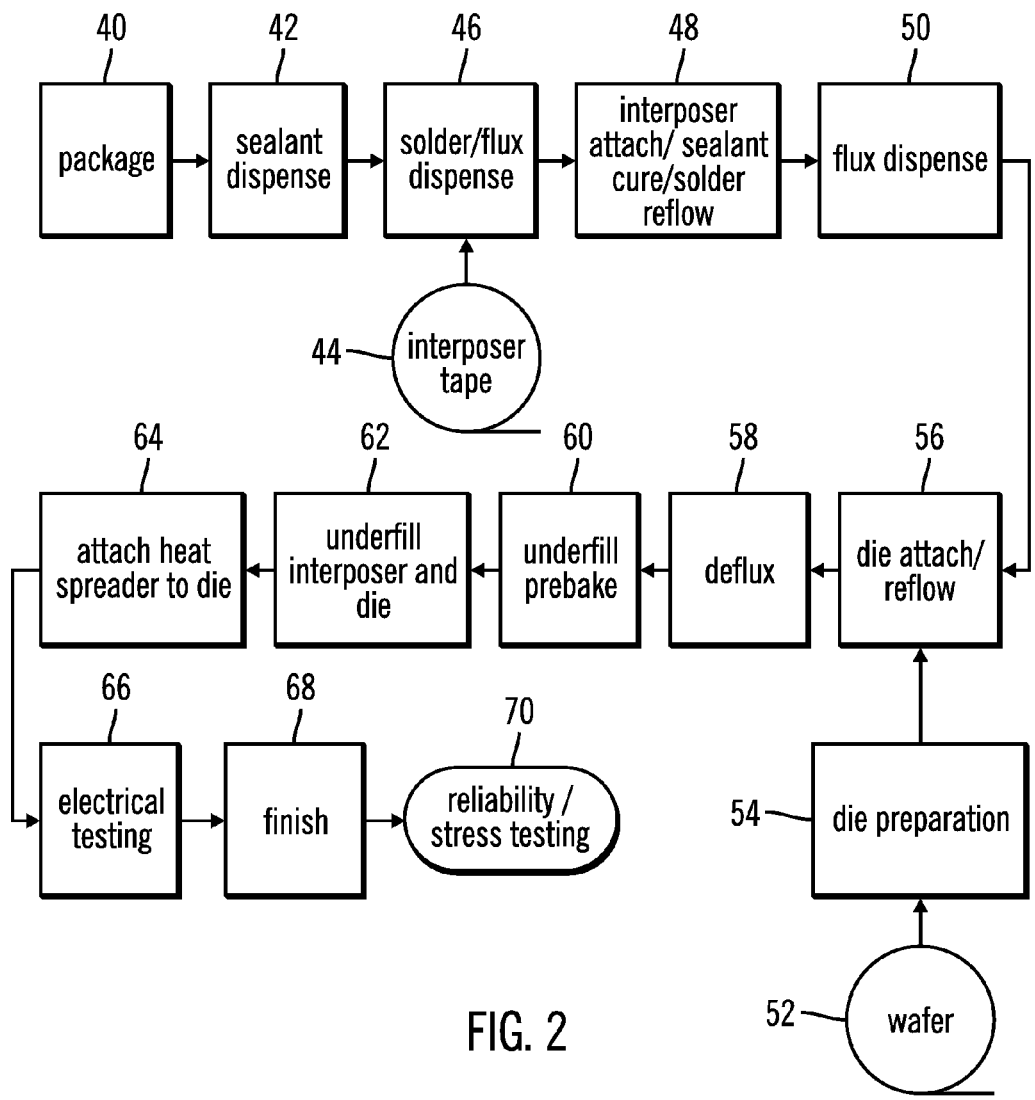
FIG. 2 is a flow chart indicating a processing scheme in accordance with certain embodiments.

FIG. 2 is a flowchart of a process scheme in accordance with certain embodiments. Block 40 provides a substrate on which an interposer and die are to be positioned. Block 42 is dispensing a sealant material for forming a gap control structure on the substrate to control the gap height between the substrate and the interposer. The gap control structure may include a plurality of individual structures formed on the substrate. The sealant material may in certain embodiments be a polymer, for example, an epoxy. Box 46 is dispensing solder and flux for coupling the interposer to the package. Box 44 is supplying the interposer, which may be in the form of a tape. Box 48 is positioning the interposer on the package, curing the sealant and reflowing the solder to couple the interposer to the package.

Box 50 is dispensing flux on the interposer for coupling the die to the interposer. Box 52 is supplying a wafer to be processed into dice. Box 54 is preparing a die to be positioned on the interposer. Box 56 is positioning the die on the interposer and attaching the die to the interposer by reflowing solder. During this operation, the gap control structures are already in place an act to control the gap height between the substrate and interposer so that it does not change during the reflow operation to attach the die to the interposer. Box 58 is defluxing the residual flux material. Box 60 is prebaking the assembly to prepare the surfaces between the substrate and the interposer and the surfaces between the interposer and the die for introduction of an underfill material. The underfill material may be formed from a variety of materials, including, for example, polymers. Box 62 is introducing the underfill material between the substrate and interposer and interposer and die. Box 64 is attaching a heat spreader to the die using a suitable process. Box 66 is electrical testing of the assembly, if desired. Box 68 indicates the process is completed. Box 70 is additional reliability and stress testing, if desired. It should be appreciated that a number of the operations described above are not necessary in various embodiments. For example, in certain embodiments, a heat spreader is not needed, and a fluxless process may be used. Other examples of steps that may be omitted include, but are not limited to, the testing steps.

Figure 3:
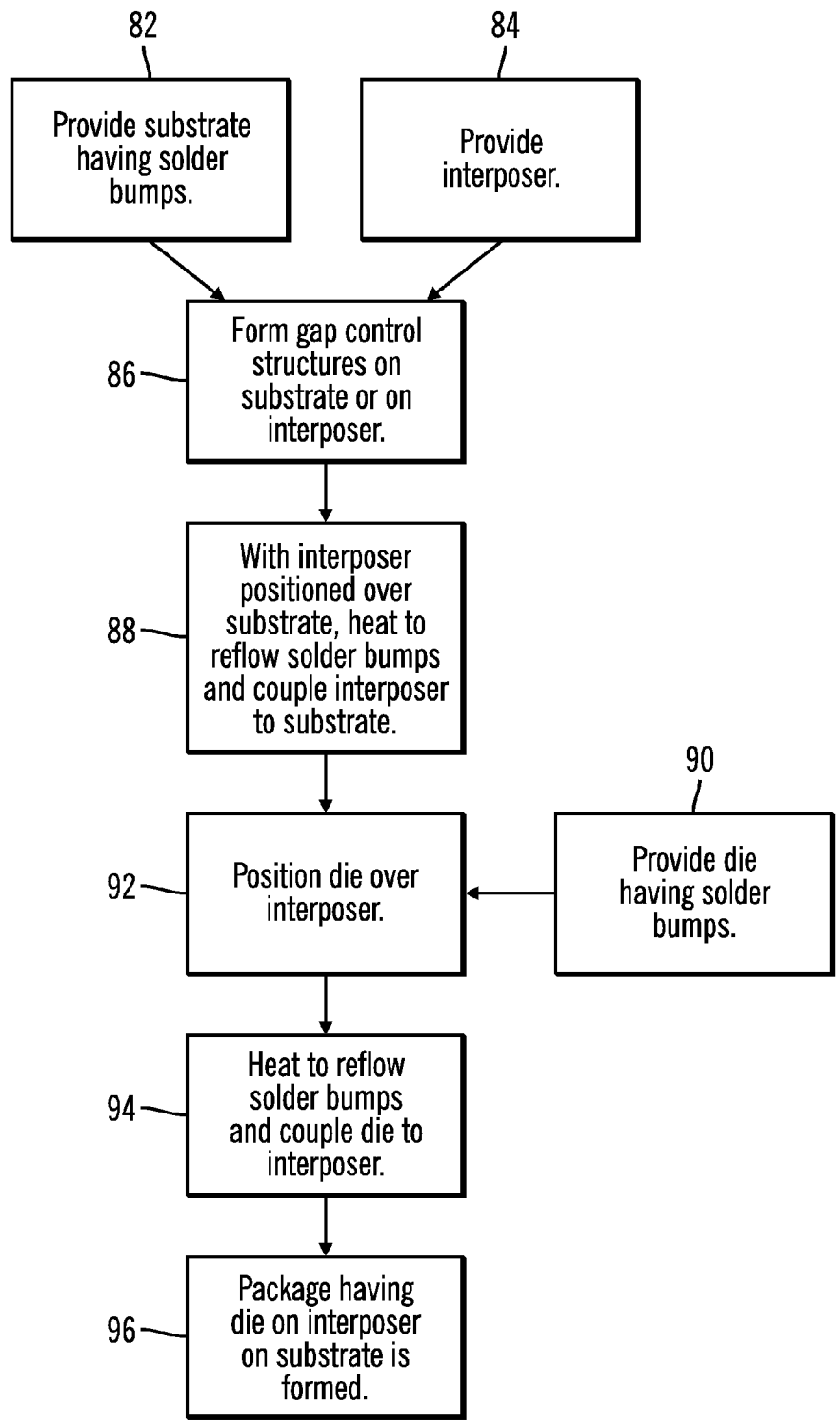
FIG. 3 is a flow chart indicating a processing scheme in accordance with certain embodiments.

FIG. 3 is another flowchart of a general process scheme in accordance with certain embodiments. Box 82 is supplying a substrate. A first group of solder bumps may be formed on the substrate. Box 84 is supplying an interposer. Alternatively, the first group of solder bumps may be formed on the interposer instead of the substrate. Box 86 is providing gap control structures. The gap control structures are in certain embodiments preferably formed on the substrate prior to positioning the interposer thereon. Alternatively, the gap control structures may be formed on the interposer. Box 88 is heating to reflow the first group of solder bumps to electrically couple the interposer to the package, while the interposer is positioned over the package (or the package is positioned over the interposer), with the first group of solder bumps and the gap control structures between the interposer and the substrate. In certain embodiments, the heating to reflow the first group of solder bumps can also be used to further process the gap control structures. A variety of materials may by used for the gap control structures. For certain types of polymeric materials, a curing step is also used. The heating to reflow the solder bumps may also serve to cure such a gap control structure material. The cured gap control structure then acts to keep the gap between the interposer and substrate from changing during subsequent heating processes which might otherwise again reflow the solder bumps coupling the interposer to the substrate.

Box 90 is providing a die to be coupled to the interposer. A second group of solder bumps are formed on the die. In an alternative embodiment, the second group of solder bumps may be formed on the interposer. Box 92 is positioning the die over the interposer (or positioning the interposer over the die), so that the second group of solder bumps is positioned between the interposer and the die. Box 94 is heating the reflow the second group of solder bumps to couple to die to the interposer. Box 96 indicates that a package including a die on an interposer on a substrate is formed. Additional operations, including for example, forming an underfill between the layers, may be performed if desired.

Figure 4:
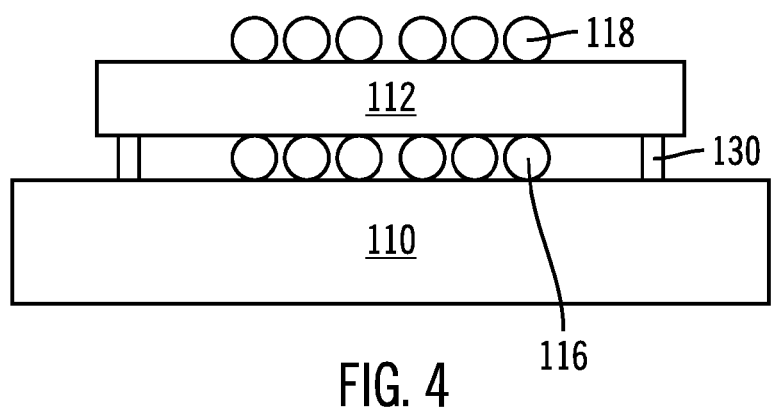
FIG. 4 is a cross-sectional side view of components of an electronic assembly including an interposer and substrate, in accordance with certain embodiments.

FIG. 4 is a side cross sectional view of a structure showing features in accordance with certain embodiments, illustrating substrate 110 having interposer 112 attached thereto. The interposer 112 is attached using first solder bumps 116. Between the interposer 112 and the substrate 110 are structures 130. The structures 130 may be formed either prior to or after the interposer 112 is attached to the substrate 110 through the first solder bumps 116. The structures 130 are formed prior to reflowing the second solder bumps 118 for attaching a die (not shown) to the interposer 102. In certain embodiments, the structures 130 are formed from a polymer material that is cured during the heating to reflow the first solder bumps 116. Alternatively, the structures 130 may be formed from materials other than polymers. In one alternative embodiment, the structures 130 are coupled to the interposer prior to the attaching the interposer to the substrate 110. The structures 130 may be separate structures that are attached to the interposer 102, or the structures may be integral to the interposer. In other alternative embodiments, the structures 130 could be coupled to the substrate 110 (either as separate structures or integral to the substrate) prior to attaching the interposer 102 to the substrate 110.

Figure 5:
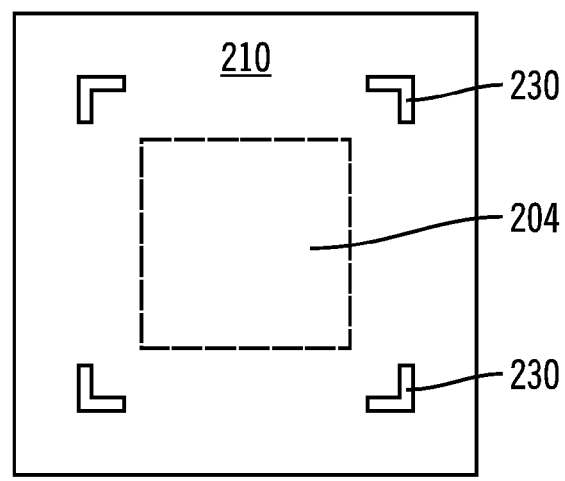
FIG. 5 is a top view of an electronic assembly including sealant structures on a substrate, in accordance with certain embodiments.

FIG. 5 is a top view of a substrate 210 having structures 230 thereon. FIG. 4 also shows the location above the substrate 210 that a die (not shown) could be positioned. This die location is indicated by region 204, defined by hatched lines. Such a die would be positioned on an interposer (not shown) that would be positioned on the structures 230. One preferred embodiment includes four L-shaped structures 230 positioned outside of the die region 204, with the orientation and positioning of the structures 230 defining four corners of a box. The structures 230 are preferably positioned outside of the region where solder bumps would be located. The structures 230 may have a variety of sizes, shapes, and orientations. While FIG. 5 shows four L-shaped structures 230, more or less could be used, and the length of the structures could be extended or shortened, as desired. In certain embodiments, an underfill material is positioned between the substrate 210 and an interposer, and between the interposer and a die. The structures 230 are preferably sized and positioned so as to permit such underfill material to be readily introduced into the appropriate regions.

Figure 6:
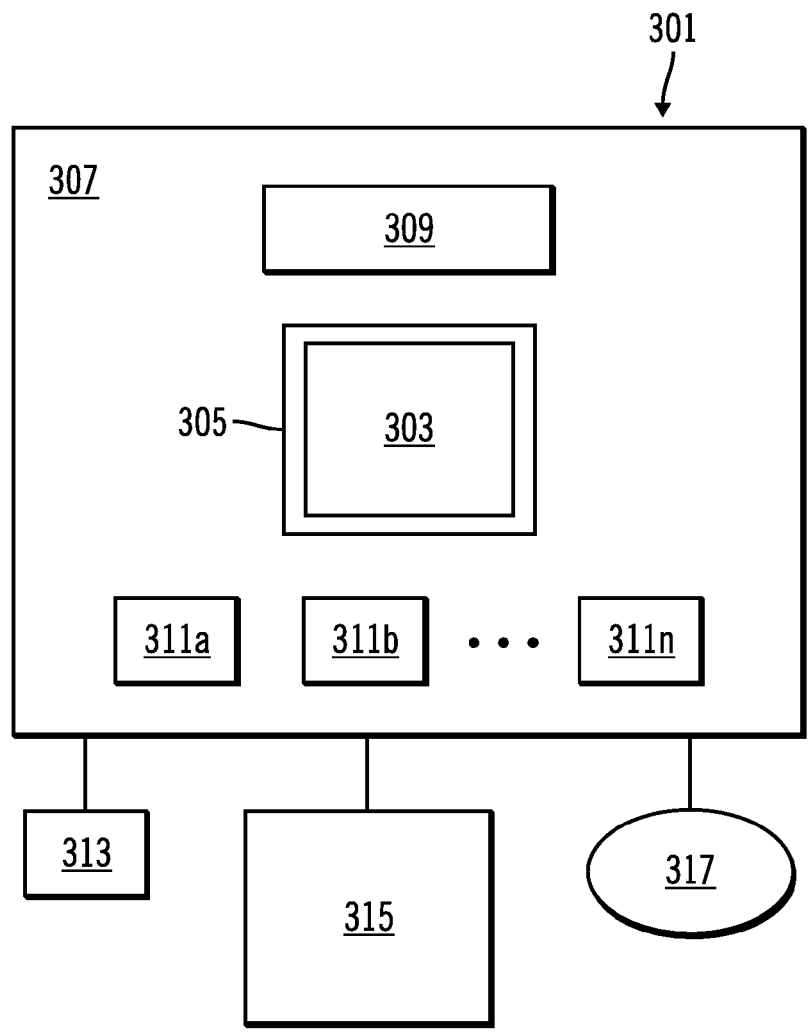
FIG. 6. illustrates one embodiment of a computing environment in which aspects of the description provided herein are embodied.

FIG. 6 illustrates one example of a computing environment in which aspects of described embodiments may be embodied. The computing environment includes a computer 301 including at least one central processing unit (CPU) 303. The CPU 303, also referred to as a microprocessor, may be attached to an integrated circuit package 305, which is then coupled to a printed circuit board 307, which in this embodiment, is a motherboard. The integrated circuit package 305 is an example of an electronic assembly that may include a substrate, interposer, die, and structures for controlling the gap height between the substrate and the interposer as described in the embodiments discussed above and shown in FIGS. 1–5.

The computer 301 further may further include memory 309 and one or more controllers 311a, 311b . . . 311n, which are also disposed on the motherboard 307. The motherboard 307 may be a single layer or multi-layered board which has a plurality of conductive lines that provide communication between the circuits in the package 305 and other components mounted to the board 307. Alternatively, one or more of the CPU 303, memory 309 and controllers 311a, 311b . . . 311n may be disposed on other cards such as daughter cards or expansion cards. The CPU 303, memory 309 and controllers 311a, 311b . . . 311n may each be seated in individual sockets or may be connected directly to a printed circuit board. A display 315 may also be included.

Any operating system and various applications as known in the art execute on the CPU 303 and reside in the memory 309. The content residing in memory 309 may be cached in accordance with known caching techniques. Programs and data in memory 309 may be swapped into storage 313 as part of memory management operations. The computer 301 may comprise any computing device known in the art, such as a mainframe, server, personal computer, workstation, laptop, handheld computer, telephony device, network appliance, virtualization device, storage controller, network controller, etc.

The controllers 311a, 311b . . . 311n may include a system controller, peripheral controller, memory controller, hub controller, I/O bus controller, video controller, network controller, storage controller, etc. For example, a storage controller can control the reading of data from and the writing of data to the storage 313 in accordance with a storage protocol layer. The storage protocol of the layer may be any of a number of known storage protocols. Data being written to or read from the storage 313 may be cached in accordance with known caching techniques. A network controller can include one or more protocol layers to send and receive network packets to and from remote devices over a network 317. The network 317 may comprise a Local Area Network (LAN), the Internet, a Wide Area Network (WAN), Storage Area Network (SAN), etc. Embodiments may be configured to transmit data over a wireless network or connection. In certain embodiments, the network controller and various protocol layers may employ the Ethernet protocol over unshielded twisted pair cable, token ring protocol, Fibre Channel protocol, etc., or any other network communication protocol known in the art.

While certain exemplary embodiments have been described above and shown in the accompanying drawings, it is to be understood that such embodiments are merely illustrative and not restrictive of the current invention, and that this invention is not restricted to the specific constructions and arrangements shown and described since modifications may occur to those having ordinary skill in the art.

What is claimed is:

1. A method of forming an electronic assembly, comprising:
    forming first solder bumps on a package substrate;
    forming a gap control structure on the package substrate, the gap control structure being spaced apart from the first solder bumps;
    positioning an interposer on the first solder bumps and on the gap control structure;
    applying heat to reflow the first solder bumps and to cure the gap control structure, wherein the reflowed first solder bumps are coupled to the package substrate and the interposer, and wherein the gap control structure is positioned between the package substrate and the interposer;
    forming second solder bumps on a die;
    positioning the die having the second solder bumps on the interposer so that the interposer is positioned between the die and the package substrate; and
    applying heat to reflow the second solder bumps on the die, wherein the reflowed second solder bumps are coupled to the interposer and the die.

2. A method as in claim 1, further comprising introducing an underfill material between the package substrate and the interposer.

3. A method as in claim 2, further comprising introducing an underfill material between the interposer and the die.

4. A method as in claim 1, further comprising forming the interposer from a material comprising a ceramic.

5. A method as in claim 1, wherein the gap control structure is formed from a material comprising a polymer.

6. A method as in claim 1, wherein the gap control structure is formed from a material comprising an epoxy.

7. A method as in claim 1, wherein the applying heat to reflow the second solder bumps also reflows the first solder bumps, and wherein the gap control structure remains rigid to inhibit a change in a gap between the package substrate and the interposer during the applying heat to reflow the second solder bumps.

8. A method of forming an electronic assembly, comprising:
    forming a plurality of first solder bumps on one of a substrate and an interposer;
    positioning the substrate and interposer so that the first solder bumps are positioned between the substrate and the interposer;
    positioning a gap control structure between the substrate and the interposer;
    performing a first reflow operation that reflows and then solidifies the first solder bumps, wherein the first reflow operation couples the interposer to the substrate;
    forming a plurality of second solder bumps on one of the interposer and a die;
    positioning the interposer and die so that the second solder bumps are positioned between the interposer and the die; and
    performing a second reflow operation that reflows and then solidifies the second solder bumps, wherein the second reflow operation couples the die to the interposer, wherein the second reflow operation also reflows the first solder bumps, wherein the gap control structure between the substrate and the interposer inhibits a change in a gap between the substrate and the interposer during the second reflow operation.

9. A method as in claim 8, further comprising forming the gap control structure from a polymer material.

10. A method as in claim 9, further comprising curing the gap control structure by applying heat to the gap control structure.

11. A method as in claim 9, wherein at least part of the curing the gap control structure takes place during the first reflow operation.

12. A method as in claim 8, further comprising forming the gap control structure to include a plurality of bodies spaced apart from one another.

13. A method as in claim 8, further comprising forming the plurality of first solder bumps on the substrate and then bringing the interposer and the first solder bumps into contact with each other prior to the first reflow operation.

14. A method as in claim 8, further comprising introducing an underfill material between the interposer and the die and between the interposer and the substrate.

* * * * *